United States Patent
Van Helvoort et al.

(10) Patent No.: US 7,746,072 B2
(45) Date of Patent: Jun. 29, 2010

(54) MRI SYSTEM COMPRISING A SCAN ROOM INTERFACE FOR A/D-CONVERSION OF MR SIGNALS BETWEEN A RECEIVER COIL UNIT AND A REMOTE SIGNAL PROCESSING UNIT

(75) Inventors: Marinus Johannes Adrianus Maria Van Helvoort, Eindhoven (NL); Marc Paul Saes, Eindhoven (NL); Johan Samuel Van Den Brink, Eindhoven (NL); Robert Paul Kleihorst, Eindhoven (NL); Paulus Cornelius Hendrikus Adrianus Haans, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 274 days.

(21) Appl. No.: 11/909,164

(22) PCT Filed: Mar. 20, 2006

(86) PCT No.: PCT/IB2006/050851

§ 371 (c)(1),
(2), (4) Date: Sep. 20, 2007

(87) PCT Pub. No.: WO2006/103591

PCT Pub. Date: Oct. 5, 2006

(65) Prior Publication Data

US 2008/0191695 A1  Aug. 14, 2008

(30) Foreign Application Priority Data

Mar. 31, 2005  (EP) .................................. 05102530

(51) Int. Cl.
*G01V 3/00* (2006.01)
(52) U.S. Cl. ....................................... 324/318; 324/309

(58) Field of Classification Search ......... 324/300–322; 600/407–435
See application file for complete search history.

(56) References Cited

U.S. PATENT DOCUMENTS 4,812,761 A * 3/1989 Vaughan, Jr. ................. 324/307

(Continued)

FOREIGN PATENT DOCUMENTS

EP  1130412 A2  9/2001

(Continued)

*Primary Examiner*—Brij B Shrivastav

(57) ABSTRACT

The present invention relates to a magnetic resonance imaging system, to a magnetic resonance imaging method for operating a magnetic resonance imaging system and to a computer program for operating a magnetic resonance imaging system. In order to considerably reduce the number of cabling in a magnetic resonance imaging system a magnetic resonance imaging system (1) is suggested, the system comprising: an examination zone (5) arranged to receive a body for examination; magnetic field generating means (9, 10, 24) for generating a magnetic field in the examination zone (5); a receiving unit (14) located in the examination zone (5) or in the vicinity of the examination zone (5); an interface unit (17) located in the examination zone (5) or in the vicinity of the examination zone (5), and arranged separately from the receiving unit (14); and a signal processing unit (21) disposed at a location (2) remote from the receiving unit (14) and the interface unit (17); wherein the receiving unit (14) comprising a receiver (15) adapted to receive a spin resonance signal generated in the examination zone (5), and a transmitter (16) adapted to transmit the spin resonance signal to the interface unit (17); and wherein the interface unit (17) comprises a receiver (20) for receiving the spin resonance signals, an analog to digital converter (19) adapted to generate a digital signal in response to the received spin resonance signal, and a transmitter (20) for transmitting the digitized signal to the signal processing unit (21).

17 Claims, 1 Drawing Sheet

U.S. PATENT DOCUMENTS

Figure 1:
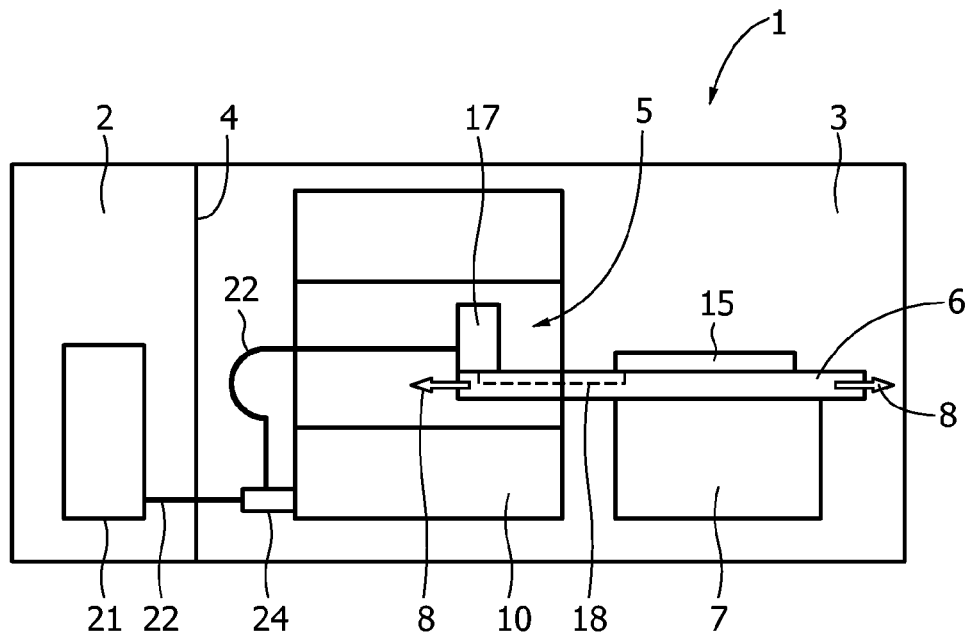

| | | |
|---|---|---|
| 5,384,536 A | 1/1995 | Murakami et al. |
| 5,491,415 A * | 2/1996 | Holmes et al. ............... 324/322 |
| 5,666,055 A | 9/1997 | Jones et al. |
| 6,498,484 B1 * | 12/2002 | Sun et al. .................... 324/303 |
| 6,759,846 B2 | 7/2004 | Van Helvoort et al. |
| 7,558,574 B2 * | 7/2009 | Feher ......................... 455/440 |
| 2003/0076105 A1 | 4/2003 | Feld et al. |
| 2008/0309341 A1 * | 12/2008 | Dooms et al. ............... 324/318 |
| 2009/0121717 A1 * | 5/2009 | Haans et al. ................. 324/322 |

FOREIGN PATENT DOCUMENTS

| | | |
|---|---|---|
| JP | 9024036 A | 1/1997 |
| JP | 2002143122 A | 5/2002 |
| WO | 03032002 A1 | 4/2003 |
| WO | 2004089211 A2 | 10/2004 |
| WO | 2006075214 A2 | 7/2006 |

* cited by examiner

MRI SYSTEM COMPRISING A SCAN ROOM INTERFACE FOR A/D-CONVERSION OF MR SIGNALS BETWEEN A RECEIVER COIL UNIT AND A REMOTE SIGNAL PROCESSING UNIT

The present invention relates to a magnetic resonance imaging system, to a magnetic resonance imaging method for operating a magnetic resonance imaging system and to a computer program for operating a magnetic resonance imaging system.

Magnetic resonance imaging is a technique which uses electromagnetic waves to form an image of objects disposed in an examination zone. In particular, magnetic resonance imaging is used to image organic tissue. In a conventional apparatus of this kind magnets are disposed so that a patient lying in an examination zone is exposed to a magnetic field. Radio waves are then transmitted into the body in the examination zone causing nuclei in atoms in the body to change orientation. As the nuclei return to their original orientation, they emit radio waves. An imaging apparatus receives the emitted radio waves in a receiving unit, and uses data derived from the received radio waves to form an image of the body examined in the examination zone.

In conventional magnetic resonance imaging apparatus, the receiving unit is disposed close to the patient in the magnet bore, and comprises one or more detecting coils/antennae. A coaxial cable connects the elements comprised in the receiving unit to a signal-processing unit for transmitting signal data to the signal-processing unit. The signal-processing unit processes those signal data. The signal-processing unit is situated in a location remote from the examination zone.

During examination of a body in the examination zone, a plurality of radio frequency antennae are used. In modern magnetic resonance scanners a high number of radio frequency channels, e.g. 8, 16, 32, 64, . . . , is used. Each antenna requires a respective coaxial cable. Thus, the more antennae are used, the more complex the coaxial cable handling around the body becomes. The use of such a large number of coaxial cables is expensive, bulky and subject to environmental interaction interfering the magnetic resonance imaging process. Furthermore part of these coaxial cables have to be routed through dynamically moving areas within the examination zone, thus compromising reliability of the system and strongly reducing freedom of design.

It is an object of the present invention to considerably reduce the number of cabling in a magnetic resonance imaging system.

This object is achieved according to the invention by a magnetic resonance imaging system, the system comprising: an examination zone arranged to receive a body for examination; magnetic field generating means for generating a magnetic field in the examination zone; a receiving unit located in the examination zone or in the vicinity of the examination zone; an interface unit located in the examination zone or in the vicinity of the examination zone, and arranged separately from the receiving unit; and a signal processing unit disposed at a location remote from the receiving unit and the interface unit; wherein the receiving unit comprising a receiver adapted to receive a spin resonance signal generated in the examination zone, and a transmitter adapted to transmit the spin resonance signal to the interface unit; and wherein the interface unit comprises a receiver for receiving the spin resonance signals, an analog to digital converter adapted to generate a digital signal in response to the received spin resonance signal, and a transmitter for transmitting the digitized signal to the signal processing unit.

The object of the present invention is also achieved by an interface unit for use in a magnetic resonance imaging system, the magnetic resonance imaging system comprising: an examination zone arranged to receive a body for examination; magnetic field generating means for generating a magnetic field in the examination zone; a receiving unit located in the examination zone or in the vicinity of said examination zone, the receiving unit comprising a receiver adapted to receive a spin resonance signal generated in the examination zone, and a transmitter adapted to transmit the spin resonance signal to the interface unit; and a signal processing unit disposed at a location remote from the receiving unit and the interface unit; wherein the interface unit is locatable in the examination zone or in the vicinity of the examination zone, and arrangable separately from the receiving unit; and wherein the interface unit comprises a receiver for receiving the spin resonance signals; an analog to digital converter adapted to generate a digital signal in response to the received spin resonance signal, and a transmitter for transmitting the digitized signal to the signal processing unit.

The object of the present invention is also achieved by a magnetic resonance imaging method for operating a magnetic resonance imaging system, said method comprising the steps of: providing an examination zone arranged to receive a body for examination; generating a magnetic field in the examination zone; receiving in the examination zone or in the vicinity of the examination zone a spin resonance signal generated in the examination zone by means of a receiving unit; transmitting the spin resonance signal from the receiving unit to an interface unit located in the examination zone or in the vicinity of the examination zone, the interface unit being arranged separately from the receiving unit; receiving the spin resonance signals; generating a digital signal in response to the received spin resonance signal in the interface unit; and transmitting the digitized signal to a signal processing unit disposed at a location remote from the receiving unit and the interface unit.

The object of the present invention is also achieved by a computer program for operating a magnetic resonance imaging system, the computer program comprising: computer instructions to transmit a spin resonance signal from a receiving unit to an interface unit being arranged separately from the receiving unit; computer instructions to receive the spin resonance signals by the interface unit; computer instructions to generate a digital signal in response to the spin resonance signal in an interface unit; and computer instructions to transmit the digitized signal from the interface unit to a signal processing unit; when the computer instructions are carried out in a computer. The technical effects necessary according to the invention can thus be realized on the basis of the instructions of the computer program in accordance with the invention. Such a computer program can be stored on a carrier or it can be available over the internet or another computer network. Prior to executing, the computer program is loaded into a computer by reading the computer program from the carrier, for example by means of a CD-ROM player, or from the internet, and storing it in the memory of the computer. The computer includes inter alia a central processor unit (CPU), a bus system, memory means, e.g. RAM or ROM etc. and input/output units.

A core idea of the invention is to reduce the number of cable by transferring the magnetic resonance signal data from the examination zone or from the vicinity of the examination zone to the remote signal-processing unit outside the examination zone using a digital format. This allows the use of a simple digital connection, e.g. a single connection wire or the like. A large bundle of coaxial cables is not needed, thus leading to a cheaper and more reliable magnetic resonance imaging system.

For this purpose the invention suggests to provide an additional interface unit adapted to digitize the signals to be transferred, said interface unit being arranged in or in the vicinity of the examination zone but separately from the receive coils of the magnetic resonance system. By not including the interface unit in immediate vicinity of the receive coils or into the receive coil arrangement itself, it is possible to keep the receive coils free of additional unnecessary elements, like electronic circuits etc. Instead the receive coils can be designed freely and without design restrictions to reach a very high coverage. In other words an optimal antenna layout can be adopted. Furthermore the receive coils can be made much more flexible, thus better adaptable to the patient. Since receive coil and transmit coil may electronically and physically be integrated, this advantage applies as well to transmit coils of the magnetic resonance imaging system.

These and other aspects of the invention will be further elaborated on the basis of the following embodiments which are defined in the dependent claims.

In a preferred embodiment of the present invention the interface unit is adapted to receive spin resonance signals from different receivers. In other words, the interface unit is adapted to collect and to merge spin resonance signals from all receive coils of the system in order to generate signals in response to the received spin resonance signals and to digitize those signals in order to transmit them in a digital way to the signal processing unit outside the examination zone. Since only one single interface unit is needed, the system design can be kept simple and inexpensive.

Because digital signals have to be transferred the interface unit and the signal-processing unit are preferably linked by a single cable or a small number of parallel galvanic cables, e.g. thin wires. Alternatively the signals are transferred using optical fibers. In this case the interface unit comprises an electro-optical transducer and a second electro-optical transducer is provided in the remote place for feeding the transmitted signals into the signal-processing unit. Alternatively a wireless link can also be used. In this case the interface unit comprises a wireless transmitter adapted to transmit the digitized signal to the signal-processing unit via radio waves or the like. Again for the signal processing unit a wireless receiver is provided. All transmitters and receivers are preferably parts of transceivers, thus enabling data transfer in both ways.

In all cases the number of cabling is reduced significantly. In order to transfer the amount of data using merely one single connection path, the interface unit is preferably adapted to provide a serial link to the signal-processing unit. Accordingly the interface unit preferably comprises a component for serializing the analogue signals before digitalization.

In another preferred embodiment of the invention the interface unit comprises signal condition means. Preferably analogue signal condition means (i.e. preamplifiers, attenuators, filters etc.) are provided in the interface unit. Such signal condition means may also be arranged in the receiving unit. However, it is preferred, that signal condition means are arranged in the interface unit only and that no signal condition is necessary in the radio frequency coils themselves; allowing a free and unlimited coil design. Preferably a preamplifier is designed such that the output signal matches with the required input voltages of the analog to digital converter. A band filter with controlled attenuation is also preferably provided downstream of the preamplifier to condition the amplified signal in order to match the amplified signal with the input of the analog to digital converter.

If the interface unit is implemented partly or completely as an integrated circuit, the dimensions of the interface unit can be very small, thus allowing to use small shield dimension. Preferably the analog to digital converter and/or the signal condition means are packaged as an integrated circuit, e.g. system on a chip, multi-chip/multi-die module. Optionally other electronics might be included on chip as well.

If integrated into a circuit the interface unit can easily be integrated into existing parts of the system. In this case it is possible to design a new tidy and uncluttered examination zone without any cables (if using a wireless link) and without any additional constructional components. In such an examination zone potential risks of damaging the equipment by a patient or an inattentive operator or assistant are highly reduced.

Preferably the interface unit is located in or at the table for positioning the body in the examination zone. In particular the interface unit is fixed to or integrated into the table top or the table top carrier. If the receive coils are connected to the movable table top or to the table top carrier as well, only short cable connections are needed to connect the receiving unit with the interface unit. The remaining cabling (if any) to the operator's room is preferably routed via the table top support, which can for example be a movable trolley.

In another preferred embodiment of the present invention combined transmit/receive coils are used. In other words the radio frequency receiver are used alternatively as radio frequency transmitter for production of measurement pulses to excite the nuclei. Preferably the same signal transmission pathway is used as for the receiving process, hence a digital to analogue converter is provided in the interface unit. The digital to analogue converter is preferably adapted to receive signal data from the operator's room, to convert those signal data, and to transmit the signal data to a generator. The generator is preferably part of the interface unit and is adapted to generate radio frequency signals for the transmitter. These radio frequency signals are preferably amplified by means of a radio frequency amplifier, which is provided for the transmit coils. The radio frequency amplifier is preferably located in the interface unit as well. The digital to analogue converter and the other components are preferably also integrated in the circuit design of the interface unit.

Figure 2:
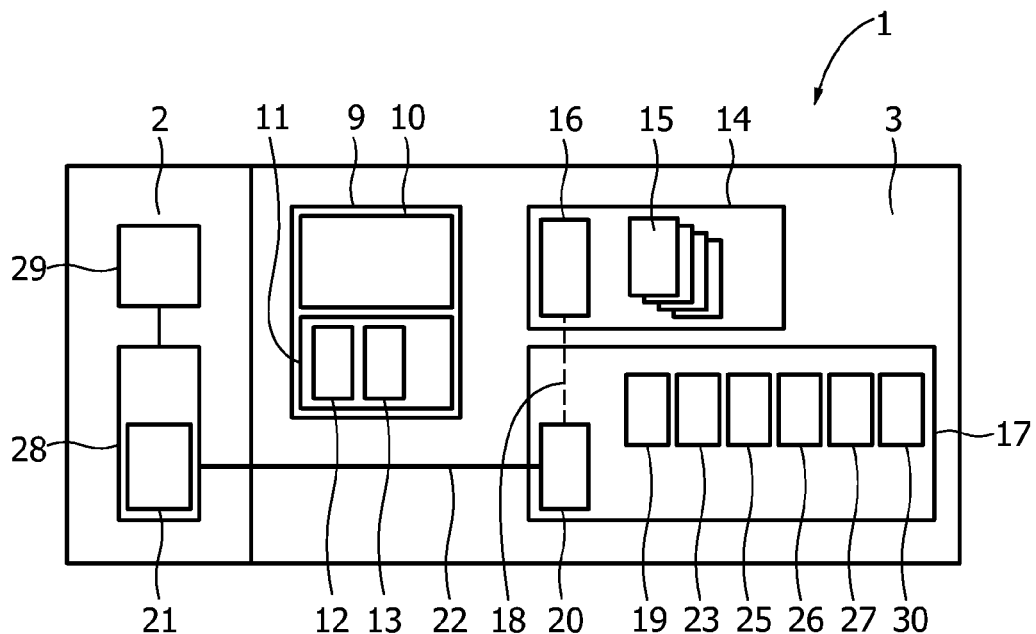

These and other aspects of the invention will be described in detail hereinafter, by way of example, with reference to the following embodiment and the accompanying drawings, in which FIG. 1 is a first picture of an magnetic resonance imaging system illustrating the arrangement of the components of the present invention, and FIG. 2 is as second more schematic picture of an magnetic resonance imaging system according to the present invention.

The magnetic resonance imaging system 1 comprises an operator's room 2 and an examination room 3, separated by an electromagnetic shielding 4. An examination zone 5 is arranged to receive a body (not shown) for examination. For thus purpose the body is placed on a table top 6 of a patient support 7. The table top 6 can be moved, which is indicated by arrows 8.

The magnetic resonance imaging system 1 further comprises magnetic field generating means 9 for generating a magnetic field in the examination zone 5. The magnetic field generating means 9 comprise a number of magnets 10 for generating a static magnetic field and a magnetic field gradient system 11, consisting of gradient amplifier 12 and gradient coils 13. The gradient system 11 is required for spatial selection and spatial encoding.

The magnetic resonance imaging system 1 further comprises a receiving/transmitting unit 14. The receiving/transmitting unit 14 is located either in the examination zone 5 or in the vicinity of the examination zone 5, depending on the position of the table top 6. The receiving/transmitting unit 14 comprised a number of receiver/transmitter in form of combined receive/transmit coils 15, adapted to acquire analogue magnetic spin resonance signals generated in the examination zone 5. The receiving/transmitting unit 14 further comprises a transceiver 16 adapted to transmit the spin resonance signal to an interface unit 17, arranged separately from the receiving/transmitting unit 14. The number of receive/transmit coils 15 are connected to the movable table top 6 and connected to the interface unit 17 using a conventional analogue coaxial cable 18 integrated into the table top 6, the cable being illustrated as a dashed line. Instead of a coaxial cable another RF conduit e.g. twisted pair or stripline may be used.

The interface unit 17 is fixed at one end of the table top 6 and located either in the examination zone 5 or in the vicinity of the examination zone, depending on the position of the table top 6. The interface unit 17 interfaces between the receive/transmit coils 15 and the table top 6 in the examination room 3 and the components of the magnetic resonance imaging system 1 located in the operators room 2. The interface unit 17 is adapted to receive spin resonance signals from all receive/transmit coils 15 of the system, i.e. it is part of a multi-channel radio frequency signal acquisition system.

The interface unit 17 comprises an analog to digital converter 19 adapted to generate a digital signal in response to the received spin resonance signal, and a transceiver 20. The transceiver 20 is adapted for receiving the signals from the transceiver 16 of the receiving/transmitting unit 14, for delivering the digitized signal to a signal processing unit 21 outside the examination room 3 via a thin single cable 22 with serial link. The interface unit 17 comprises a component 23 for serializing the analogue signals before digitalization. Optionally the interface unit 17 comprises digital signal processing means (not shown) for carrying out a pre-processing of the digitized signals prior to transmission to the signal processing unit. The single cable 22 runs from the transceiver 20 of the interface unit 17 to the signal processing unit 21 via a control device 24 of the magnetic field generating means 9.

The interface unit 17 further comprises signal condition means 30, in particular a preamplifier adapted to match the output signal with the required input voltages of the analog to digital converter 19. The signal condition means 30 further comprises a band filter with controlled attenuation to condition the amplified signal in order to match the amplified signal with the input of the analog to digital converter 19.

The interface unit 17 comprises a digital to analogue converter 25 for converting signal data received from the operator's room 2 by the transceiver 20. The converted signal data is then transmitted from the digital to analogue converter 25 to a generator 26 adapted to generate radio frequency signals for the transmit coils 15. Additionally a radio frequency amplifier 27 is provided in the interface unit 17 for amplifying the radio frequency signals. The radio frequency signals are transferred to the transceiver 16 of the receiving/transmitting unit 14. The transceiver 16 is adapted to receive those signals. The required power supply for the interface unit 17 is not shown.

Because the interface unit 17 is not included in the coils 15, the coil design is not restricted or limited. The advantage of free coil design can even be better exploited, if other electronics are removed from the coils 15 itself. For example the detuning means (not shown) for changing the resonance frequency of the receive coils, which include electronic circuits and switches, might be removed. This can be arranged by using a quarter lambda transmission line (not shown) between coils and detuning means.

The signal processing unit 21 of the magnetic resonance imaging system 1 is located in the operator's room 2 remote from the examination zone 5, the receiving unit 14 and the interface unit 17. The signal processing unit 21 is adapted for digital signal processing, hence the transmitted digital data can be fed into the signal processing unit 21 without any further conversion. The signal processing unit 21 is part of an acquisition and control system 28 for digital signal processing, image processing, and data acquisition control. The acquisition and control system 28 is linked to a reconstruction system 29, where measured data are reconstructed and displayed. The acquisition and control system 28 including the signal processing unit 21 as well as the reconstruction system 29 is (at least partly) implemented as a computer software executed in a computer.

It will be evident to those skilled in the art that the invention is not limited to the details of the foregoing illustrative embodiments, and that the present invention may be embodied in other specific forms without departing from the spirit or essential attributes thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein. It will furthermore be evident that the word "comprising" does not exclude other elements or steps, that the words "a" or "an" do not exclude a plurality, and that a single element, such as a computer system or another unit may fulfill the functions of several means recited in the claims. Any reference signs in the claims shall not be construed as limiting the claim concerned.

1 MRI system
2 operators room
3 examination room
4 shielding
5 examination zone
6 table top
7 patient support
8 arrow
9 magnetic field generation means
10 magnet
11 magnetic field gradient system
12 gradient amplifier
13 gradient coil
14 receiving/transmitting unit
15 receive/transmit coil
16 transceiver
17 interface unit
18 coaxial cable
19 A/D converter
20 transceiver
21 signal processing unit
22 single cable
23 serializer
24 control device
25 D/A converter
26 RF generator
27 RF amplifier
28 acquisition and control system
29 reconstruction system
30 signal condition means.

The invention claimed is:

1. A magnetic resonance imaging system, the system comprising:
    at least one magnet disposed in an MRI exam room which generates a static magnetic field in an examination zone arranged to receive a subject for examination;
    at least one coil which acquires a spin resonance signal generated in the examination region;
    a receiving unit which includes a transceiver that receives the spin resonance signal from the coils and transmits the spin resonance signal to an interface unit, the receiving unit being located in the MRI exam room in or in the vicinity of the examination zone;
    wherein the interface unit includes a transceiver which receives the spin resonance signal from the receiving unit and an analog-to-digital converter which digitizes the received spin resonance signal and the interface transceiver transmits the digitized spin resonance signal to a signal processing unit, the interface unit being located in the MRI exam room in or in the vicinity of the examination zone and arranged separately from the receiving unit; and
    wherein the signal processing unit is disposed outside of and shielded from the MRI exam room at a location remote from the receiving unit and the interface unit.

2. The magnetic resonance imaging system according to claim 1, wherein the interface unit receives spin resonance signals from a plurality of receiving units.

3. The magnetic resonance imaging system according to claim 1, wherein the interface unit and the signal processing unit are linked by a single cable.

4. The magnetic resonance imaging system according to claim 3, wherein the receiving unit transceiver and the interface transceiver are connected by an electric cable.

5. The magnetic resonance imaging system according to claim 3, wherein the receiving unit is disposed in a support which positions a subject in the examination region.

6. The magnetic resonance imaging system according to claim 1, wherein the interface unit further includes:
    a signal conditioner which matches the received spin resonance signal to input characteristics of the analog-to-digital converter.

7. The magnetic resonance imaging system according to claim 1, wherein the interface unit is an integrated circuit.

8. The magnetic resonance imaging system according to claim 1, wherein the interface unit is located in a table for positioning the body in the examination zone.

9. The magnetic resonance imaging system according to claim 1, further including:
    a transmitter which generates measurements pulses.

10. The magnetic resonance imaging system according to claim 9, wherein the interface unit further including:
    a generator adapted to generate which generates radio frequency signals for the transmitter.

11. The magnetic resonance imaging system according to claim 1, wherein the interface unit further includes:
    a component which serializes the analog signals received by the interface transceiver and supplies the serialized analog signals to the analog-to-digital converter.

12. The magnetic resonance imaging system according to claim 11, wherein the interface unit further includes:
    a digital signal processor which pre-processes the digitized spin resonance signal before the interface transceiver transmits the digitized spin resonance signal to the signal processing unit.

13. The magnetic resonance imaging system according to claim 12, wherein the interface unit further includes:
    a digital-to-analog converter which converts digital signals received by the interface transceiver from outside the MRI exam room to analog signals;
    a radiofrequency generator which generates radiofrequency signals whose frequency is controlled by the analog signals from the digital-to-analog converter, the radiofrequency signals being communicated via the interface transceiver and the receiving unit transceiver to the at least one coil.

14. The magnetic resonance imaging system according to claim 13, wherein the interface unit further includes:
    a preamplifier which matches a voltage of the analog signal to input voltages of the analog-to-digital converter.

15. The magnetic resonance imaging system according to claim 13, wherein the interface unit and the signal processing unit are linked by a single cable.

16. A magnetic resonance imaging method for operating a magnetic resonance imaging system, said method comprising the steps of:
    generating a static magnetic field in an examination zone arranged to receive a subject for examination;
    inducing a spin resonance signal in the examination region:
    receiving the spin resonance signal by a receiving unit, the receiving unit being located in or in the vicinity of the examination region;
    transmitting the spin resonance signal from the receiving unit to an interface unit located in or in the vicinity of the examination zone, the interface unit being arranged separately from the receiving unit;
    in the interface unit, digitizing the received spin resonance signal; and
    transmitting the digitized signal to a signal processing unit the signal processing unit being disposed at a location remote from the receiving unit and the interface unit.

17. A computer readable medium which stores a program for operating a magnetic resonance imaging system, to perform the steps of:
    generating a static magnetic field in an examination zone arranged to receive a subject for examination;
    including a spin resonance signal in the examination region;
    receiving the spin resonance signal by a receiving unit, the receiving unit being located in or in the vicinity of the examination region;
    transmitting the spin resonance signal from the receiving unit to an interface unit located in or in the vicinity of the examination zone, the interface unit being arranged separately from the receiving unit;
    digitizing the spin resonance signal received by the interface unit; and
    transmitting the digitized signal to a signal processing unit, the signal processing unit is disposed at a location remote from the receiving unit and the interface unit.

* * * * *